(12) United States Patent
Ko et al.

(10) Patent No.: US 11,355,663 B2
(45) Date of Patent: Jun. 7, 2022

(54) METHOD OF MANUFACTURING AN ELECTRONIC DEVICE

(71) Applicant: PETALUX INC., Seongnam-si (KR)

(72) Inventors: Seok Nam Ko, Yongin-si (KR); Do Yeol Ahn, Seoul (KR); Seung Hyun Yang, Yongin-si (KR)

(73) Assignee: PETALUX INC., Seongnam-si (KR)

( * ) Notice: Subject to any disclaimer, the term of this patent is extended or adjusted under 35 U.S.C. 154(b) by 58 days.

(21) Appl. No.: 16/965,473

(22) PCT Filed: Dec. 27, 2018

(86) PCT No.: PCT/KR2018/016744
§ 371 (c)(1),
(2) Date: Jul. 28, 2020

(87) PCT Pub. No.: WO2019/146920
PCT Pub. Date: Aug. 1, 2019

(65) Prior Publication Data
US 2021/0057604 A1 Feb. 25, 2021

(30) Foreign Application Priority Data
Jan. 29, 2018 (KR) .................. 10-2018-0010627

(51) Int. Cl.
*H01L 33/00* (2010.01)
*H01L 33/30* (2010.01)
(Continued)

(52) U.S. Cl.
CPC ........ *H01L 33/0075* (2013.01); *H01L 33/005* (2013.01); *H01L 33/007* (2013.01);
(Continued)

(58) Field of Classification Search
CPC . H01L 33/0083; H01L 33/0075; H01L 33/40; H01L 33/0093; H01L 33/0095;
(Continued)

(56) References Cited

U.S. PATENT DOCUMENTS

2001/0053599 A1* 12/2001 Pyo ................... H01L 21/76843
438/618
2011/0114995 A1* 5/2011 Ahn ...................... H01L 33/005
257/103

(Continued)

FOREIGN PATENT DOCUMENTS

KR 10-2012-0057646 6/2012
KR 10-2014-0003124 1/2014
(Continued)

OTHER PUBLICATIONS

English translation of the International Search report, corresponding to International Application No. PCT/KR2018/016744, dated Apr. 12, 2019.

*Primary Examiner* — Savitri Mulpuri
(74) *Attorney, Agent, or Firm* — Kile Park Reed & Houtteman PLLC

(57) ABSTRACT

A method of manufacturing an electronic device according to the present invention, comprises: preparing a substrate; forming an n-type semiconductor including a III-V compound semiconductor or a II-VI compound semiconductor material on the substrate; forming a metal thin film including at least one of copper (Cu), silver (Ag), gold (Au), titanium (Ti), and nickel (Ni) on the n-type semiconductor; and forming a p-type semiconductor on the n-type semiconductor by iodinizing the metal thin film using any one of liquid iodine (I), solid iodine (I), and gas iodine (I). Therefore, it is possible to overcome the limitation of the light emission efficiency of the p-type semiconductor by providing a hybrid type electronic device and a manufacturing method.

13 Claims, 5 Drawing Sheets

(51) Int. Cl.
  *H01L 33/40* (2010.01)
  *H01L 33/32* (2010.01)
  *H01L 33/28* (2010.01)
(52) U.S. Cl.
  CPC ...... *H01L 33/0083* (2013.01); *H01L 33/0093* (2020.05); *H01L 33/0095* (2013.01); *H01L 33/28* (2013.01); *H01L 33/30* (2013.01); *H01L 33/32* (2013.01); *H01L 33/40* (2013.01)
(58) Field of Classification Search
  CPC ... H01L 33/007; H01L 33/0016; H01L 33/32; H01L 33/28; H01L 33/00; H01L 33/005; H01L 33/0008; H01L 2933/001
  See application file for complete search history.

(56) References Cited

U.S. PATENT DOCUMENTS

| | | | | |
|---|---|---|---|---|
| 2011/0177642 | A1* | 7/2011 | Kusunoki | H01L 33/007 438/46 |
| 2013/0171805 | A1* | 7/2013 | Kraus | H01L 21/02436 438/478 |
| 2014/0054788 | A1* | 2/2014 | Majima | B82Y 40/00 257/773 |
| 2015/0371899 | A1* | 12/2015 | Zhang | C23C 18/1834 438/666 |

FOREIGN PATENT DOCUMENTS

| | | |
|---|---|---|
| KR | 10-1548901 | 9/2015 |
| KR | 10-2017-0140563 | 12/2017 |
| WO | 2009-106583 | 9/2009 |

* cited by examiner

METHOD OF MANUFACTURING AN ELECTRONIC DEVICE

TECHNICAL FIELD

The present invention relates to a method of manufacturing an electronic device, and more particularly, the present invention relates to a method of manufacturing an electronic device with a PN junction.

BACKGROUND ART

Among single element semiconductors, Si semiconductors, which have been researched and developed to be commercialized since the 1950s, have the advantages of low cost of material, ease to obtain Si oxide by thermal oxidation, and ease to make a table surface protective film, so that it satisfies the characteristics required by all devices. However, the problem is that it is difficult to grow a completely large single crystal, and since the band gap is small at 1.1 eV, it is not suitable as a semiconductor device requiring high thermal stability and high efficiency. In addition, it is also unsuitable for the functions of wide band gap (WBG) semiconductors or narrow band gap semiconductors.

As an alternative material that has recently been spotlighted, group III-V compound semiconductors and group II-VI compound semiconductors are wideband gap semiconductor materials, and are useful as high-power, high-frequency electronic devices. However, due to the difference in vapor pressure in the group III-V compound semiconductor and the group II-VI compound semiconductor element, only n-type semiconductor single crystals are grown, and p-type single crystals are rarely grown, thus a PN junction is hardly formed. For this reason, Mg doping is usually required to form a p-type semiconductor, and the Mg-doped III-V group compound semiconductor or II-VI group compound semiconductor degrades the performance of the p-type semiconductor by hydrogen bonding. In addition, crystal growth and device processing are difficult due to the strong chemical bonding ability. Because of these phenomena, wide bandgap semiconductors are facing limitations in application to various fields compared to applicability.

DETAILED DESCRIPTION OF THE INVENTION

Objects of the Invention

Accordingly, the problem to be solved by the present invention is to provide a method of manufacturing a hybrid type electronic device capable of overcoming the limitations of applying a p-type semiconductor of a wide band gap semiconductor and improving the luminous efficiency.

Technical Solution

The method of manufacturing an electronic device according to the present invention for solving the problems, comprises: preparing a substrate; forming an n-type semiconductor including a III-V compound semiconductor or a II-VI compound semiconductor material on the substrate; forming a metal thin film including at least one of copper (Cu), silver (Ag), gold (Au), titanium (Ti), and nickel (Ni) on the n-type semiconductor; and forming a p-type semiconductor on the n-type semiconductor by iodinizing the metal thin film using any one of liquid iodine (I), solid iodine (I), and gas iodine (I).

For example, the iodinizing the metal thin film, may comprise immersing the substrate on which the metal thin film is formed in liquid iodine; taking the substrate on which the metal thin film out of the liquid iodine; and removing residual iodine.

In this case, the immersing the substrate on which the metal thin film is formed in liquid iodine may be performed within a range of 60 seconds to 100 seconds.

In addition, the immersing the substrate on which the metal thin film is formed in liquid iodine may be performed in a state where the substrate is turned over so that the metal thin film faces down.

In addition, the removing the residual iodine may be performed by heating the substrate or blowing nitrogen gas ($N_2$) on the substrate, in a state that the substrate is turned over.

Alternatively, wherein the iodinizing the metal thin film may be performed by contacting the metal thin film with solid iodine in an air or nitrogen environment at room temperature.

In this case, the contacting the metal thin film with solid iodine may be performed for at least 12 hours.

Alternatively, the iodinizing the metal thin film may be performed through vaporizing solid iodine by heating, and blowing vaporized iodine toward the metal thin film.

In this case, the iodinizing the metal thin film, may further comprise mixing the vaporized iodine with a carrier gas after vaporizing solid iodine by heating.

In this case, the carrier gas may be nitrogen gas (N2), and the blowing vaporized iodine toward the metal thin film may be performed for 10 to 60 minutes.

On the other hand, the group III-V compound semiconductor may be GaN, GaP, GaAs, InP, AlGaN, AlGaP, AlInGaN, InGaAs, GaAsP, or a combination of two or more, and the II-VI compound semiconductor may be CdO, CdS, CdSe, CdTe, ZnO, ZnS, ZnSe, ZnTe, CdZnTe, HgCdTe, HgZnTe, or a combination of two or more.

On the other hand, after the step of forming the n-type semiconductor, the method may further comprise forming a first cladding layer comprising a III-V semiconductor or II-VI semiconductor material on the n-type semiconductor; forming an active layer comprising a III-V semiconductor or II-VI semiconductor material on the first cladding layer; and forming a second cladding layer comprising an I-VII semiconductor on the active layer.

Furthermore, the method may comprise forming a third cladding layer between forming the active layer and forming the second cladding layer, wherein the third cladding layer comprises a group III-V semiconductor or group II-VI semiconductor material.

Advantageous Effects

According to the method of manufacturing an electronic device according to the present invention, since a semiconductor is naturally grown without a doping process when forming a p-type semiconductor, it may be advantageous to form a high-purity single crystal. Also, defects due to lattice mismatch between the substrate and the semiconductor can be fundamentally solved.

In addition, the I-VII compound semiconductor is capable of crystal growth at a low temperature, so the process is easy and material stability can be secured.

In addition, it can emit light in a wide range of wavelengths, and the wavelength range can be selected according to the application. Furthermore, with the diversification of the semiconductor industry, various needs can be met.

MODE FOR INVENTION

Figure 1:
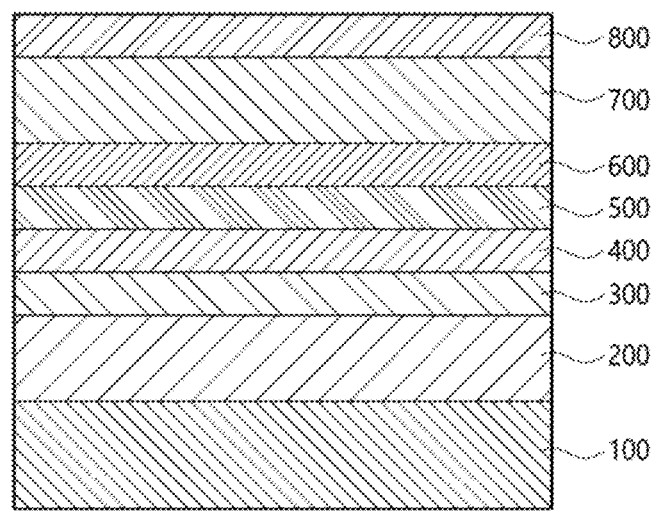
FIG. 1 is a cross-sectional view showing a light emitting device according to an exemplary embodiment of the present invention.

The present invention may have various changes and may have various forms, and specific embodiments will be illustrated in the drawings and described in detail in the text. However, this is not intended to limit the present invention to a specific disclosure form, it should be understood to include all modifications, equivalents, and substitutes included in the spirit and scope of the present invention. In describing each drawing, similar reference numerals are used for similar components. In the accompanying drawings, the dimensions of the structures may be exaggerated than actual ones for clarity of the present invention.

Terms such as first and second may be used to describe various components, but the components should not be limited by the terms. The terms are used only for the purpose of distinguishing one component from other components. For example, the first component may be referred to as a second component without departing from the scope of the present invention, and similarly, the second component may also be referred to as a first component.

Terms used in the present application are only used to describe specific embodiments, and are not intended to limit the present invention. Singular expressions include plural expressions unless the context clearly indicates otherwise. In this application, terms such as "include" or "have" are intended to indicate the existence of a feature, number, step, operation, component, part, or combination thereof described in the specification, and it should be understood that the existence of one or more addition possibilities of numbers, steps, actions, components, parts or combinations thereof are not excluded in advance. In addition, A and B are 'connected' and 'joined' means not only for direct connection between A and B, but that other component C may be included between A and B to connect or join A and B.

Unless otherwise defined, all terms used herein, including technical or scientific terms, have the same meaning as commonly understood by a person skilled in the art to which the present invention pertains. Terms such as those defined in a commonly used dictionary should be interpreted as having meanings consistent with meanings in the context of related technologies, and should not be interpreted as ideal or excessively formal meanings unless explicitly defined in the present application. In addition, in the claims of a method invention, unless each step is clearly bound to the order, the order of each step may be interchanged with each other.

Hereinafter, exemplary embodiments of the present invention will be described in detail with reference to the accompanying drawings.

FIG. 1 is a cross-sectional view showing a light emitting device 1000 according to an exemplary embodiment of the present invention.

Referring to FIG. 1, the electronic device 1000 according to the present invention includes a substrate 100, a first semiconductor layer 200 and a second semiconductor layer 700.

Also, the electronic device 1000 may further include at least one of the first cladding layer 300, the active layer 400, and the second cladding layer 600. The first semiconductor layer 200 may be formed on the substrate 100 and may include a group III-V compound semiconductor or a group II-VI compound semiconductor. In addition, the first cladding layer 300 may be formed on the first semiconductor layer 200. In addition, the active layer 400 may be formed on the first cladding layer 300, and may include a III-V compound semiconductor or a II-VI compound semiconductor. In addition, the second cladding layer 600 may be formed on the active layer 400. In addition, the second semiconductor layer 700 may be formed of a group I-VII compound semiconductor or on the second cladding layer 600.

In addition, the first semiconductor layer 200 may be an n-type semiconductor, and the second semiconductor layer 700 may be composed of a p-type semiconductor. Generally, a group III-V compound semiconductor or group II-VI compound semiconductor is mainly used to form a wide bandgap semiconductor, and in order to form a p-type semiconductor by the group III-V compound semiconductor and group II-VI compound semiconductor, impurity doping treatment is inevitable. In addition, when the group III-V compound semiconductor and group II-VI compound semiconductor are Mg-doped to form a p-type semiconductor, the ability to form holes decreases and efficiency decreases due to strong hydrogen bonds.

However, the I-VII compound semiconductor is easy to process because a p-type semiconductor is formed only by crystal growth, and it can be processed at a low temperature. In addition, the group I-VII compound semiconductor has a high efficiency because the band gap energy is greater than that of the group III-V compound semiconductor and the group II-VI compound semiconductor.

In addition, the first cladding layer 300 may be made of a group III-V compound semiconductor or a group II-VI compound semiconductor. In addition, the second cladding layer 600 may be formed of a group I-VII compound semiconductor.

In general, the electron movement speed in the semiconductor device is very fast compared to the movement speed of the hole, and thus, an electron overflow phenomenon occurs in the p-type semiconductor. This causes deterioration of light efficiency. When the first cladding 300 and the second cladding layer 600 are formed according to the present invention, these light efficiency limitations can be overcome.

In addition, the electronic device 1000 may further include a third cladding layer 500 between the active layer 400 and the second cladding layer 600, and the third cladding layer 500 may be formed of III-V compound semiconductor or a group II-VI compound semiconductor material.

Heterojunctions formed by contacting two different semiconductor materials have different energy gaps, resulting in discontinuity of the energy band at the junction interface. For this reason, there is a limitation in material selection because the lattice constant must fit well, and there is a difficulty in solving the step joining problem. Group III-V compound semiconductors have a wurtzite crystal structure, whereas copper (Cu) based group I-VII compound semiconductors have a zinc blend crystal structure, and thus have different crystal structures. Because of this, good quality crystal growth is not easy.

However, the electronic device 1000 may include a third cladding layer 500 including a III-V compound semiconductor or a II-VI compound semiconductor material, which is a buffer in hetero-epitaxial growth. By growing an I-VII compound semiconductor on the third cladding layer 500, defects due to lattice mismatch can be fundamentally solved.

In addition, a transparent electrode layer 800 may be further formed on the second semiconductor layer.

The transparent electrode layer 800 may be made of any one of Ni/Au, ITO, CTO, TiWN, $IN_2O_3$, $SnO_2$, CdO, ZnO, $CuGaO_2$ and $SrCu_2O_2$.

In addition, the electronic device 1000 according to the present invention may further include a phosphor layer (not shown), which can be applied to products for various lighting and display.

The electronic device according to the present invention may include a semiconductor device and a photo-conversion layer containing a phosphor. The electronic device may include a substrate, an n-type semiconductor layer, a first cladding layer, an active layer, a second cladding layer, and a p-type semiconductor layer. At this time, the n-type semiconductor layer may be formed of a group III-V compound semiconductor or a group II-VI compound semiconductor on the substrate. In addition, the first cladding layer may be formed of a group III-V compound semiconductor or a group II-VI compound semiconductor on the n-type semiconductor layer. In addition, the active layer may be formed of a group III-V compound semiconductor or a group II-VI compound semiconductor on the first cladding layer. In addition, the second cladding layer may be formed of a group I-VII compound semiconductor on the active layer. In addition, the p-type semiconductor layer may be composed of a group I-VII compound semiconductor on the second cladding layer.

In addition, the light emitting diode may further include a third cladding layer between the active layer and the second cladding layer, and the third cladding layer may be formed of a group III-V compound semiconductor or a group II-VI compound semiconductor.

Figure 2:
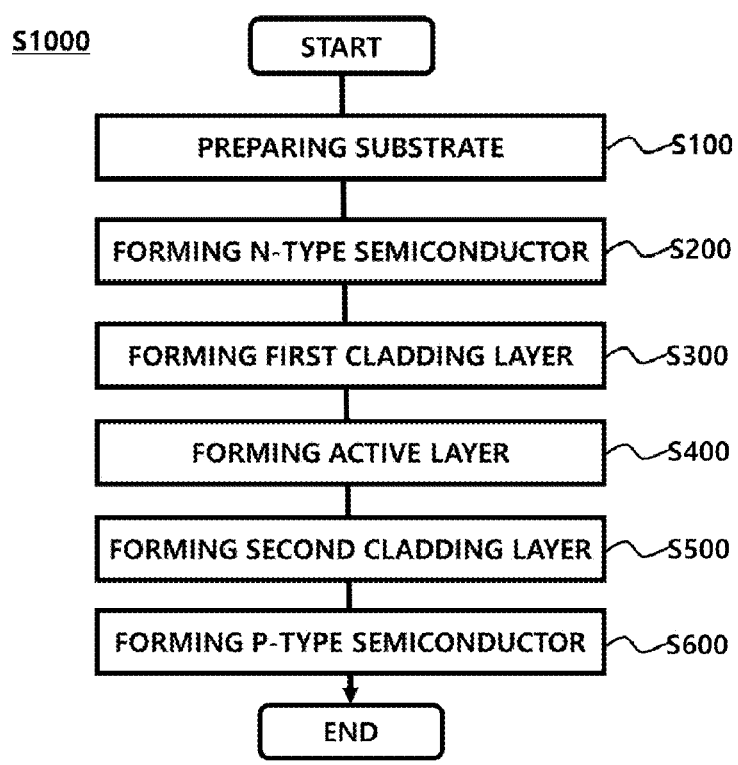
FIG. 2 is a flow chart showing a method for manufacturing a light emitting device according to an exemplary embodiment of the present invention.
Figure 3:
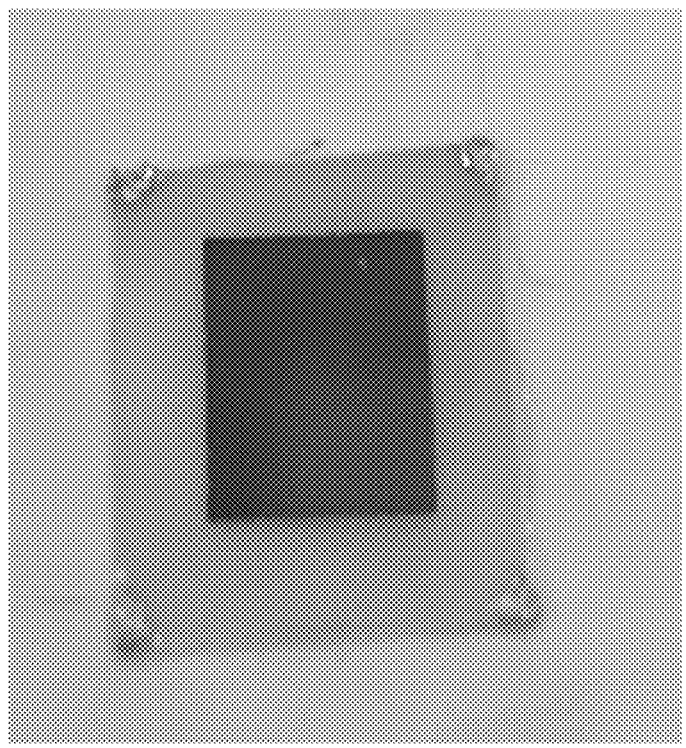
FIG. 3 and FIG. 4, respectively, are photographs showing a copper thin film, and a copper iodide thin film that is changed by being immersed in iodine in a liquid phase as an experimental result of the present invention.
Figure 4:
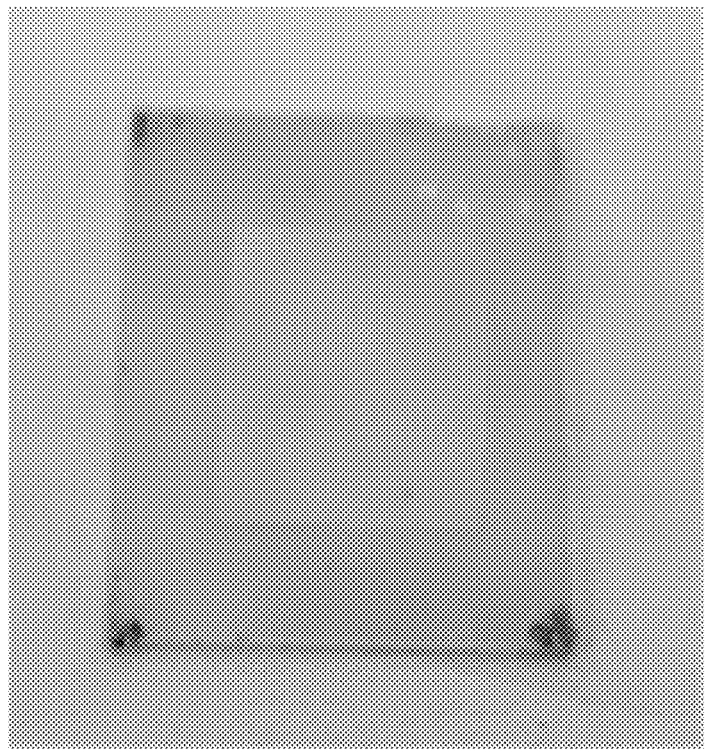
Figure 5:
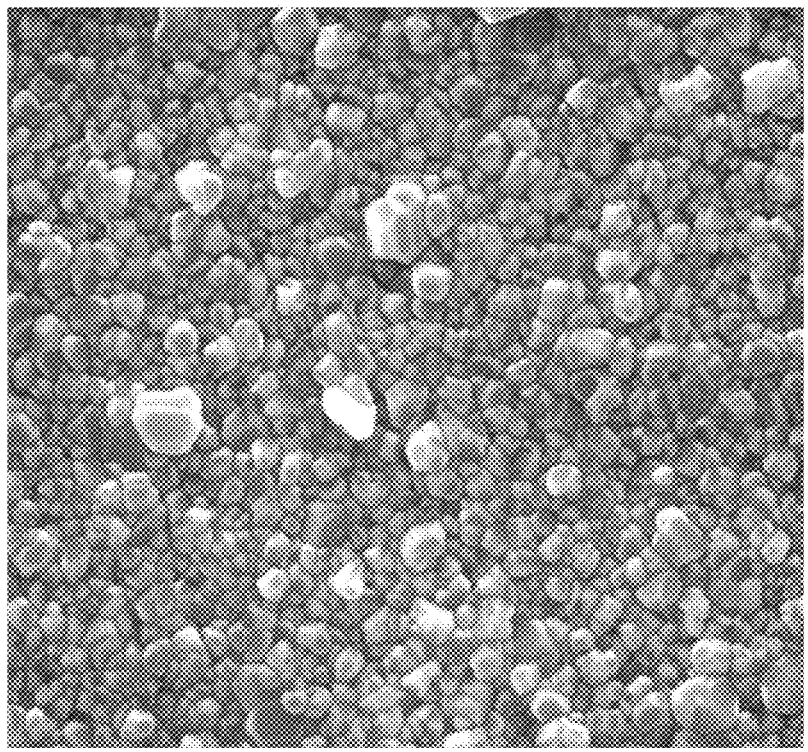
FIG. 5 is a SEM photograph of the copper iodide thin film of FIG. 4.

FIG. 2 is a flow chart showing a method for manufacturing a light emitting device according to an exemplary embodiment of the present invention.

Referring to FIG. 2, the method of manufacturing an electronic device (S1000) according to the present invention includes preparing a substrate (S100), forming an n-type semiconductor (S200), and forming a p-type semiconductor (S600). On the other hand, the method of manufacturing an electronic device (S1000) according to the present invention may include one of the steps of forming a first cladding layer (S300), forming an active layer (S400), and forming a second cladding layer (S500).

In the forming of the n-type semiconductor (S200), a group III-V compound semiconductor or a group II-VI compound semiconductor material may be used, and the n-type semiconductor may be formed on the substrate.

In addition, in forming the first cladding layer (S300), the first cladding layer may be formed on the n-type semiconductor. In addition, in forming the active layer (S400), the active layer may be formed on the first cladding layer, and the active layer may include a group III-V compound semiconductor or a group II-VI compound semiconductor material. In addition, in forming the second cladding layer (S500), the second cladding layer may be formed on the active layer.

In addition, in forming the p-type semiconductor (S600), the p-type semiconductor may be formed on the second cladding layer, and may be performed through forming a metal thin film and iodizing the metal thin film.

In this case, the metal thin film may include at least one of copper (Cu), silver (Ag), gold (Au), titanium (Ti), and nickel (Ni). The metal thin film may be formed, for example, through vapor deposition or sputtering. For example, the thickness of the metal thin film is preferably formed to 1 nm or less.

In iodizing the metal thin film, any one of liquid iodine (I), solid iodine (I), and gaseous iodine (I) may be used.

As an example, when describing a method using liquid iodine, first, a substrate on which a metal thin film is formed is immersed in liquid iodine. As a result of the experiment, when a liquid iodine having a purity of 99% was used, it was confirmed that after an immersion time of about 60 seconds to 100 seconds, 1 nm thick copper thin film was completely changed to copper iodide (CuI).

Thereafter, the substrate on which the metal thin film is formed is taken out from the liquid iodine. At this time, it is preferable to take out the substrate in an inverted state so that the metal thin film faces downward. As described above, when the substrate is taken out in an inverted state, iodine in a liquid state remaining on the substrate is even in each region of the substrate, and uniformity of electronic elements formed in each region of the substrate can be improved.

Thereafter, iodine remaining on the substrate may be removed. In order to quickly remove the iodine remaining on the substrate, the substrate may be heated, or the gas may be blown or blown while being heated. In this case, the heating temperature of the substrate can be heated to about 100° C., and the nitrogen gas (N2) can be blown.

In this case, as a result of testing the properties of copper iodide, the resistance was measured to be 0.1 to 0.5 Ω·cm, the bulk carrier density was $1\times10^{18}$ to $5\times10^{18}$ cm$^{-3}$, and the mobility was 10 to 30 cm$^2$V$^{-1}$S$^{-1}$.

As another embodiment, as a step of iodizing the metal thin film, a method of using solid iodine is described, first, a solid iodine is brought into contact with the metal thin film. As a result of the experiment, it was confirmed that when a solid iodine with a purity of 99% was used, the contact time was required for at least 12 hours to change the copper thin film of 1 nm thickness to copper iodide. As described above, when the solid iodine is contacted to the copper thin film to change copper to copper iodide, the experimental results show that the resistance is 0.01 to 0.05 Ω·cm, the bulk carrier density is $1\times10^{19}$ to $5\times10^{19}$ cm$^{-3}$, and the mobility is 1 to 10 cm$^2$V$^{-1}$S$^{-1}$. When the copper iodide is formed by using solid iodine, it was confirmed that the bulk carrier density was increased by 10 times so that the resistance was greatly reduced to about $\frac{1}{10}$, and the mobility was also significantly reduced compared to the case where the liquid iodine was applied as previously described.

As another embodiment, as a step of iodizing the metal thin film, a method of using gas iodine is described. Followed by heating and vaporizing solid iodine, and then blowing the vaporized iodine to the metal thin film. For example, solid iodine can be heated to about 80° C.

On the other hand, after the solid iodine is vaporized by heating, the vaporized iodine may be mixed with a carrier gas, and then the mixed gas may be blown to a metal thin film. At this time, nitrogen gas or argon gas can be used as the carrier gas. When the mixed gas is blown at 0.5 to 1 L/min, after about 10 to 60 minutes, the copper thin film having a thickness of 1 nm is changed to copper iodide.

When gas iodine is brought into contact with the copper thin film to convert the copper thin film to copper iodide, the results of the experiment show that the resistance is 0.01 to 0.05 Ω·cm, the bulk carrier density is $1 \times 10^{19}$ to $5 \times 10^{19}$ cm$^{-3}$, and the mobility is 1 to 10 cm$^2$V$^{-1}$S$^{-1}$, same as using solid iodine.

Therefore, depending on the required physical properties, a liquid iodine and a solid or gas iodine can be used.

On the other hand, referring again to FIG. 2, the method of manufacturing an electronic device may further include a step of forming a third cladding layer between the step of forming the active layer (S400) and the step of forming the second cladding layer (S500). Further, the third cladding layer may include a III-V compound semiconductor or a II-VI compound semiconductor material.

In addition, in the method for manufacturing a semiconductor light emitting body (S1000), each step may be sequentially or two or more steps may be performed simultaneously, but the order is not limited.

Further, the group III-V compound semiconductor may be formed of any one of GaN, GaP, GaAs, InP, AlGaN, AlGaP, AlInGaN, InGaAs, GaAsP, or a combination of two or more.

In addition, the II-VI compound semiconductor may be formed of any one of CdO, CdS, CdSe, CdTe, ZnO, ZnS, ZnSe, ZnTe, CdZnTe, HgCdTe, HgZnTe, or a combination of two or more.

According to the method of manufacturing an electronic device according to the present invention, since a semiconductor is naturally grown without a doping process when forming a p-type semiconductor, it may be advantageous to form a high-purity single crystal. Also, defects due to lattice mismatch between the substrate and the semiconductor can be fundamentally solved.

In addition, the I-VII compound semiconductor is capable of crystal growth at a low temperature, so the process is easy and material stability can be secured.

In addition, it can emit light in a wide range of wavelengths, and the wavelength range can be selected according to the application. Furthermore, with the diversification of the semiconductor industry, various needs can be met.

Although the present invention has been described in the detailed description of the invention with reference to exemplary embodiments of the present invention, it will be understood to those skilled in the art that various modifications and variation can be made in the present invention without departing from the spirit or scope of the invention.

The invention claimed is:

1. A method of manufacturing an electronic device, comprising:
preparing a substrate;
forming an n-type semiconductor including a III-V compound semiconductor or a II-VI compound semiconductor material on the substrate;
forming a metal thin film including at least one of copper (Cu), silver (Ag), gold (Au), titanium (Ti), and nickel (Ni) on the n-type semiconductor; and
forming a p-type semiconductor on the n-type semiconductor by iodinizing the metal thin film using any one of liquid iodine (I), solid iodine (I), and gas iodine (I).

2. The method of manufacturing an electronic device of claim 1, wherein the iodinizing the metal thin film, comprises:
immersing the substrate on which the metal thin film is formed in liquid iodine;
taking the substrate on which the metal thin film out of the liquid iodine; and
removing residual iodine.

3. The method of manufacturing an electronic device of claim 2, wherein the immersing the substrate on which the metal thin film is formed in liquid iodine is performed within a range of 60 seconds to 100 seconds.

4. The method of manufacturing an electronic device of claim 2, wherein the immersing the substrate on which the metal thin film is formed in liquid iodine is performed in a state where the substrate is turned over so that the metal thin film faces down.

5. The method of manufacturing an electronic device of claim 4, wherein the removing the residual iodine is performed by heating the substrate or blowing nitrogen gas (N$_2$) on the substrate, in a state that the substrate is turned over.

6. The method of manufacturing an electronic device of claim 1, wherein the iodinizing the metal thin film is performed by contacting the metal thin film with solid iodine in an air or nitrogen environment at room temperature.

7. The method of claim 6, wherein the contacting the metal thin film with solid iodine is performed for at least 12 hours.

8. The method of manufacturing an electronic device of claim 1, wherein the iodinizing the metal thin film, comprises:
vaporizing solid iodine by heating; and
blowing vaporized iodine toward the metal thin film.

9. The method of manufacturing an electronic device of claim 8, wherein the iodinizing the metal thin film, further comprises:
mixing the vaporized iodine with a carrier gas after vaporizing solid iodine by heating.

10. The method of manufacturing an electronic device of claim 9, wherein the carrier gas is nitrogen gas (N2), and the blowing vaporized iodine toward the metal thin film is performed for 10 to 60 minutes.

11. The method of manufacturing an electronic device of claim 1, wherein the group III-V compound semiconductor is GaN, GaP, GaAs, InP, AlGaN, AlGaP, AlInGaN, InGaAs, GaAsP, or a combination of two or more, and
the II-VI compound semiconductor is CdO, CdS, CdSe, CdTe, ZnO, ZnS, ZnSe, ZnTe, CdZnTe, HgCdTe, HgZnTe, or a combination of two or more.

12. The method of manufacturing an electronic device of claim 1, after the step of forming the n-type semiconductor, the method further comprising:
forming a first cladding layer comprising a III-V semiconductor or II-VI semiconductor material on the n-type semiconductor;
forming an active layer comprising a III-V semiconductor or II-VI semiconductor material on the first cladding layer; and
forming a second cladding layer comprising an I-VII semiconductor on the active layer.

13. The method of manufacturing an electronic device of claim 12, further comprising:
forming a third cladding layer between forming the active layer and forming the second cladding layer, wherein the third cladding layer comprises a group III-V semiconductor or group II-VI semiconductor material.

* * * * *